(12) United States Patent
Kishishita

(10) Patent No.: US 7,227,202 B2
(45) Date of Patent: Jun. 5, 2007

(54) SEMICONDUCTOR DEVICE AND CELL

(75) Inventor: Keisuke Kishishita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 65 days.

(21) Appl. No.: 11/024,464

(22) Filed: Dec. 30, 2004

(65) Prior Publication Data
US 2005/0151220 A1 Jul. 14, 2005

(30) Foreign Application Priority Data
Jan. 8, 2004 (JP) ............................ 2004-003169

(51) Int. Cl.
*H01L 27/02* (2006.01)
(52) U.S. Cl. ............... 257/207; 257/202; 257/210; 257/E23.153
(58) Field of Classification Search ............ 257/202, 257/207
See application file for complete search history.

(56) References Cited

U.S. PATENT DOCUMENTS 5,619,048 A * 4/1997 Yokota et al. ............... 257/207
6,296,088 B1 10/2001 Carlson
6,677,649 B2 1/2004 Osada et al.
6,794,674 B2 * 9/2004 Kusumoto ............... 257/23.153

FOREIGN PATENT DOCUMENTS

JP 6-088854 3/1994
JP 2002-261245 A 9/2002

* cited by examiner

*Primary Examiner*—Andy Huynh
*Assistant Examiner*—Dao H. Nguyen
(74) *Attorney, Agent, or Firm*—McDermott Will & Emery LLP

(57) ABSTRACT

A cell 100 includes three wiring layers (a gate electrode layer, a source/drain electrode layer and a terminal layer) on a semiconductor substrate including transistors formed thereon. One of the wiring layers (the terminal layer) in which input terminals 151 and output terminals 152 for connecting the cell to another cell are formed includes a power supply line passing region 153 through which a power supply line for supplying a power supply voltage and a ground voltage from an external power supply to the transistors in the cell can be provided.

14 Claims, 12 Drawing Sheets

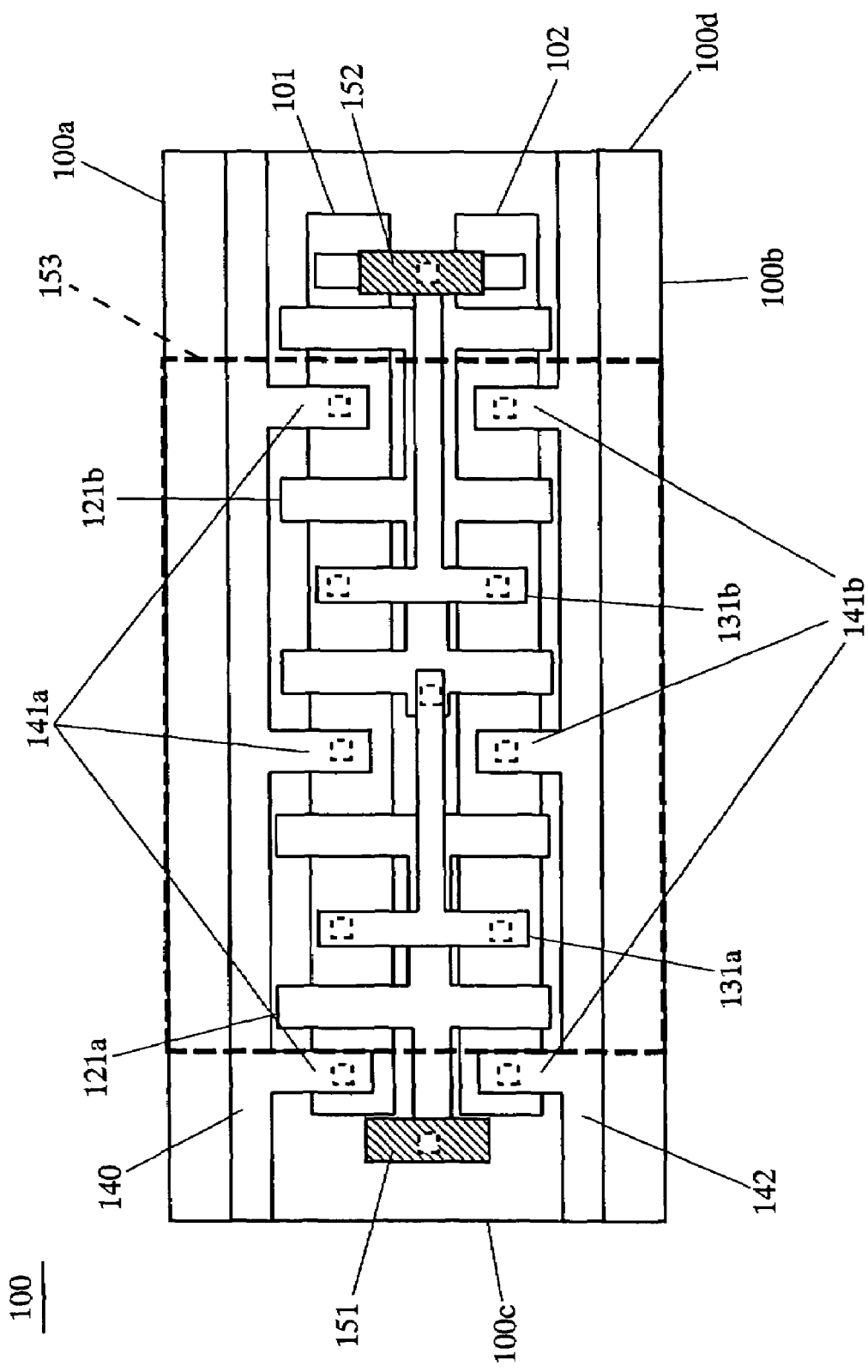
F I G. 1

SEMICONDUCTOR DEVICE AND CELL

BACKGROUND OF THE INVENTION

1. Field of the Invention

The present invention relates to a semiconductor device and a cell.

2. Description of the Background Art

Along with recent advancements in the miniaturization techniques, the degree of integration of integrated circuits (semiconductor devices) is increasing. FIG. 12 is a partially cutaway plan view showing a conventional semiconductor device 1200 as disclosed in Japanese Laid-Open Patent Publication No. 2002-261245. The semiconductor device 1200 includes a plurality of cells 1201, a power supply line 1203b, a ground line 1203a, a strap power supply line 1202b and a strap ground line 1202a. Each cell 1201, being a circuit component forming a circuit together with other cells, may be, for example, a basic cell that implements an AND gate or a NAND gate, or a cell including a plurality of gates such as AND gates. An intended integrated circuit can be realized by combining a plurality of such cells together.

The power supply line 1203b is electrically connected to a power supply pad (not shown) provided in the I/O region around the semiconductor device 1200. The ground line 1203a is electrically connected to a ground pad (not shown) provided in the I/O region around the semiconductor device 1200. The power supply line 1203b and the ground line 1203a extend parallel to each other. Although not shown in FIG. 12, the supply line 1203b and the ground line 1203a alternate with each other. Moreover, the power supply line 1203b and the ground line 1203a are formed in the same wiring layer.

The strap power supply line 1202b extending perpendicular to the power supply line 1203b is formed in the same wiring layer as the power supply line 1203b, and is electrically connected to the power supply line 1203b. The strap ground line 1202a extending perpendicular to the ground line 1203a is electrically connected to the ground line 1203a. The strap power supply line 1202b and the strap ground line 1202a alternate with each other with an interval therebetween that is dictated by the height of the cell 1201. The cells 1201 in each horizontal row 1201X as shown in FIG. 12 are supplied with a power supply voltage from the power supply line 1203b via the strap power supply line 1202b and a ground voltage from the strap ground line 1202a via the strap ground line 1202a. The input terminal of each cell 1201 is connected to the output terminal of another cell via signal lines 1206, 1207, etc.

If the degree of circuit integration is increased without changing the power supply voltage, the power consumption of the circuit increases. In view of this, the power supply voltage is conventionally decreased as the degree of circuit integration is increased. As the power supply voltage is decreased, the absolute value of the threshold voltage of each transistor formed in a cell is also decreased. The lower the threshold voltage is, the more likely it is that a transistor may malfunction because of voltage fluctuations due to noise. Therefore, a stable power supply voltage with no variations should be supplied to the cells.

In order to suppress variations among power supply voltages to the cells, the line resistance should be suppressed. The line resistance can be suppressed by increasing the number of power supply lines connected in parallel to one another to reduce the resistance of each power supply line, or by increasing the width of each power supply line.

However, if the number of power supply lines or the width thereof is increased, the area of the region in which the power supply line or the ground line is formed increases, thereby increasing the overall size of the semiconductor device. A larger size of a semiconductor device means a smaller number of semiconductor chips per wafer and a lower production yield, which both increase the production cost.

If the width of the power supply line is increased, the space in which signal lines can be provided is decreased, and the signal lines connecting cells together may need to be routed around, making it more difficult to meet the signal timing constraints. If there is a signal line that does not meet the timing constraints, it is necessary to reexamine the HDL design (design using a hardware description language) or to modify the layout design until the timing constraints are met, thereby increasing the number of design steps and the overall design period. Thus, there should be a sufficient space for placing signal lines without much routing around.

SUMMARY OF THE INVENTION

Therefore, an object of the present invention is to provide a semiconductor device, in which variations in the power supply voltage and the ground voltage can be suppressed, having a small overall area, and yet having a sufficient space for placing signal lines without routing around.

A cell according to the present invention is a cell including two or more wiring layers and being a component of a semiconductor integrated circuit, the cell including: one or more transistors formed on a semiconductor substrate; a pair of intracellular power supply lines for supplying a power supply voltage and a ground voltage to the one or more transistors; and a connection terminal of a circuit formed by the one or more transistors, wherein at least one power supply line passing region is provided in one of the wiring layers in which the intracellular power supply lines are not provided so that an intercellular power supply line having a width larger than those of the intracellular power supply lines can pass through the at least one power supply line passing region.

In a preferred embodiment, the connection terminal is formed in the same wiring layer as the at least one power supply line passing region.

In a preferred embodiment, the pair of intracellular power supply lines extend parallel to each other, and the at least one power supply line passing region has a shape such that the intercellular power supply line can pass through the at least one power supply line passing region in a direction perpendicular to the intracellular power supply lines.

In a preferred embodiment, two sides of a perimeter of the at least one power supply line passing region coincide with at least portions of two sides of a perimeter of the cell. In a preferred embodiment, the at least one power supply line passing region has a rectangular shape.

In a preferred embodiment, a side of a perimeter of the at least one power supply line passing region is a predetermined distance or more away from the connection terminal. In a preferred embodiment, the predetermined distance is determined based on a predetermined width of the intercellular power supply line.

In a preferred embodiment, wherein an arrangement of the terminal is determined based on a predetermined interval between two adjacent intercellular power supply lines.

In a preferred embodiment, an arrangement of the terminal is determined based on a predetermined direction in which the intercellular power supply line is passed.

In a preferred embodiment, a width of the cell is larger than that of the intercellular power supply line.

In a preferred embodiment, at least one of the one or more transistors is formed in a region of the semiconductor substrate that corresponds to the at least one power supply line passing region.

In a preferred embodiment, a minimum width of the at least one power supply line passing region is larger than a width of the intercellular power supply line.

In a preferred embodiment, a length of the intercellular power supply line is larger than that of a side of a perimeter of the cell.

A semiconductor device according to the present invention is a cell-based semiconductor integrated circuit including two or more wiring layers, the semiconductor integrated circuit including: one or more cells each including a transistor formed on a semiconductor substrate, a pair of intracellular power supply lines for supplying a power supply voltage and a ground voltage to the transistor, and a connection line for connecting the cell to another cell, wherein a power supply line passing region is provided in one of the wiring layers in which the intracellular power supply lines are not provided so that a power supply line having a width larger than those of the intracellular power supply lines can pass through the power supply line passing region; and an intercellular power supply line that passes through the power supply line passing region in at least one of the one or more cells.

In a preferred embodiment, the intercellular power supply line is electrically connected to the intracellular power supply lines in at least one of the one or more cells.

In a preferred embodiment, the semiconductor device includes a connection terminal provided at an end of the connection line; and an arrangement of the connection terminal in at least one of the one or more cells is different from that in other cells.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a cell of the present invention;

DESCRIPTION OF THE PREFERRED EMBODIMENTS

First Embodiment

Figure 2:
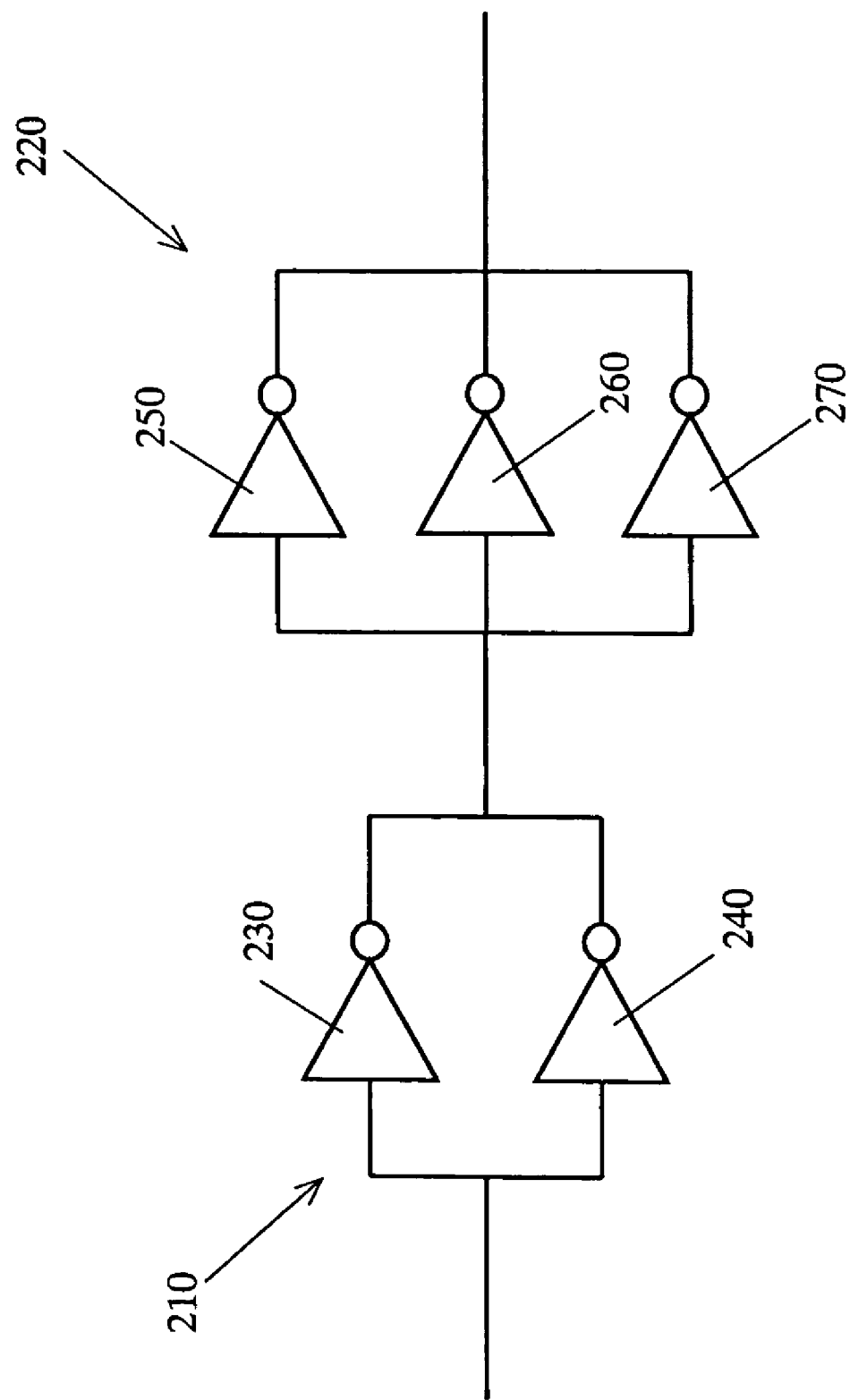
FIG. 2 shows a logic circuit diagram of the cell of FIG. 1.

FIG. 1 is a layout diagram showing a cell 100 according to the first embodiment of the present invention. Referring to FIG. 1, the cell 100 includes a semiconductor substrate on which a P-channel transistor region 101 and an N-channel transistor region 102 are provided. On the semiconductor substrate, the cell 100 includes a preceding gate electrode section 121a (input gate), a subsequent gate electrode section 121b, a preceding drain electrode section 131a, a subsequent drain electrode section 131b (output drain), source electrodes 141a and 141b, a strap power supply line 140, a strap ground line 142, an input terminal 151 and an output terminal 152. The cell 100 has a rectangular shape whose perimeter is defined by long sides 100a and 100b and short sides 100c and 100d.

Referring to FIG. 2, the cell 100 is a logic circuit including a preceding block 210 and a subsequent block 220 connected in series with each other. The preceding block 210 includes two inverters 230 and 240 connected in parallel to each other, and the subsequent block 220 includes three inverters 250, 260 and 270 connected in parallel to one another. While the structure, etc., of the cell 100 will later be described in greater detail, the cell 100 includes a power supply line passing region 153 in one wiring layer. A cell such as the cell 100 is a functional unit of a logic circuit registered in a cell library used when designing an integrated circuit using an automated design tool.

Figure 3:
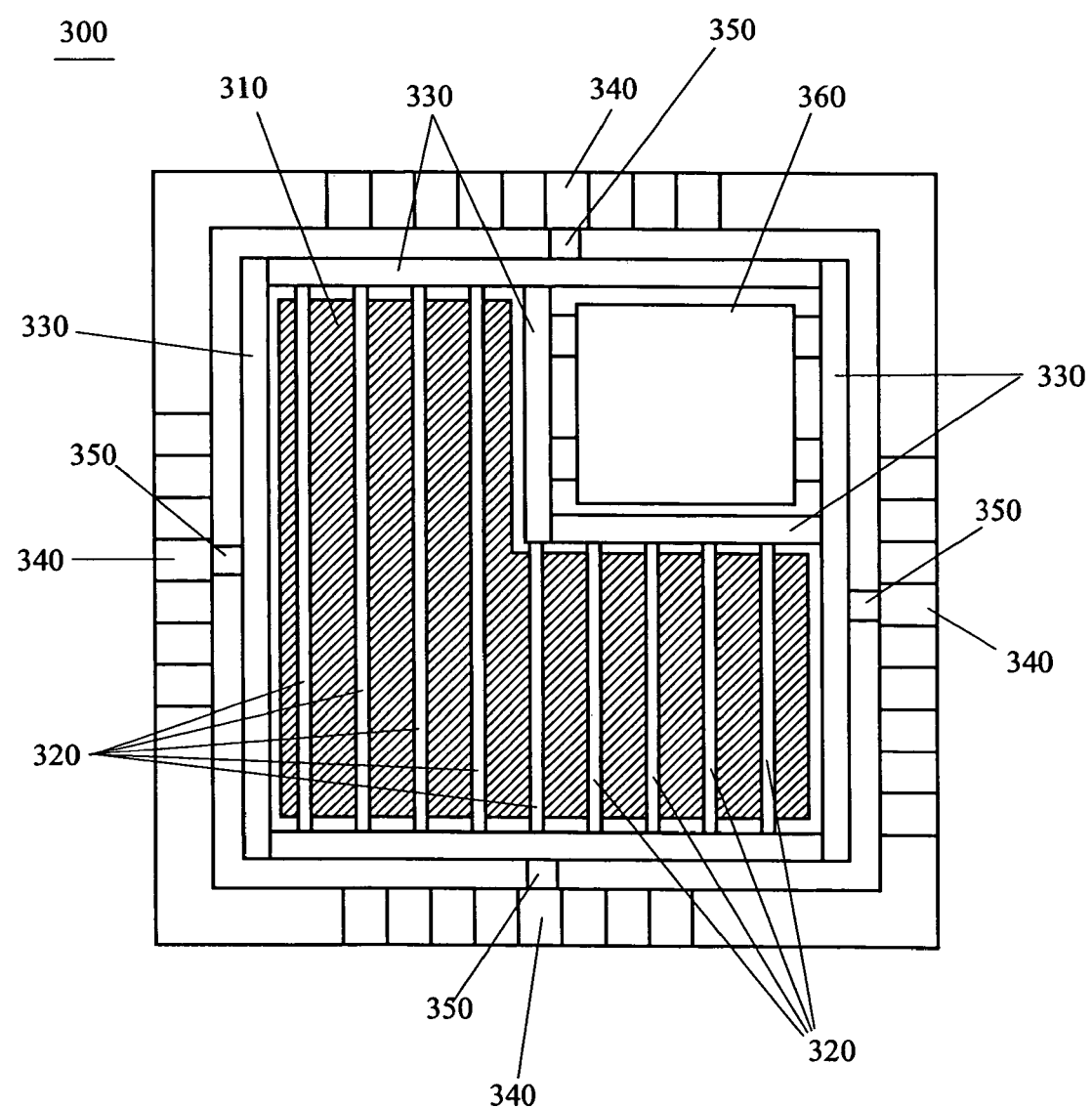
FIG. 3 is a plan view showing a semiconductor device of the present invention.

FIG. 3 is a plan view showing a semiconductor device 300, which is an exemplary semiconductor device of the present invention. A cell arrangement region 310 is where cells such as the cell 100 are arranged together to realize an intended integrated circuit. The cell arrangement region 310 is provided with a power supply voltage from power supply lines 320 extending in parallel to one another at a predetermined interval across the cell arrangement region 310. The power supply lines 320 electrically connect together two opposing sides of a ring line 330 surrounding the cell arrangement region 310. Power supply I/O cells 340 (power supply pads) are provided around the ring line 330. The power supply I/O cells 340 receive a power supply from outside the semiconductor device 300, and apply a predetermined power supply voltage and a ground voltage to the cells arranged in the cell arrangement region 310. Each power supply I/O cell 340 is electrically connected to the ring line 330 via an I/O connection line 350. An SRAM 360 provided outside the cell arrangement region 310 is also electrically connected to the ring line 330 and receives a power supply from the power supply I/O cell 340.

It is only required that the semiconductor device of the present invention includes at least one cell that has the power supply line passing region 153, as does the cell 100, and the power supply line 320. The ring line 330 and the power supply I/O cells 340 as shown in FIG. 3 are not indispensable components of the semiconductor device of the present invention. The arrangement of the power supply lines 320 shown in FIG. 3 is merely an example. In the cell arrangement region 310, cells may be arranged in any direction. Note that power supply lines and ground lines are both referred to as power supply lines in the present embodiment.

Figure 4A:
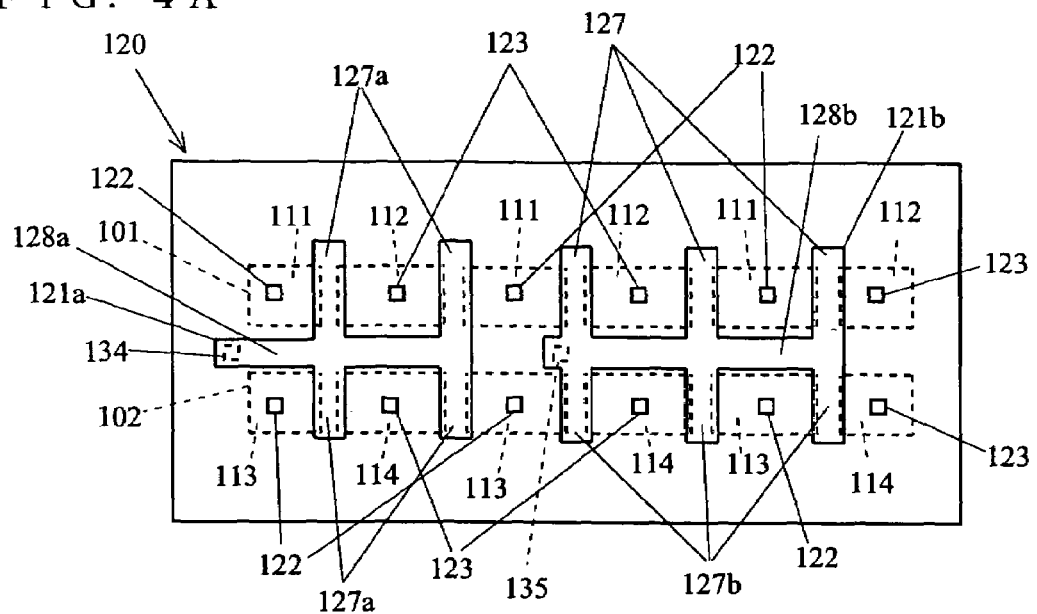
FIG. 4A to FIG. 4C each show a wiring layer of the cell of FIG. 1.
Figure 4B:
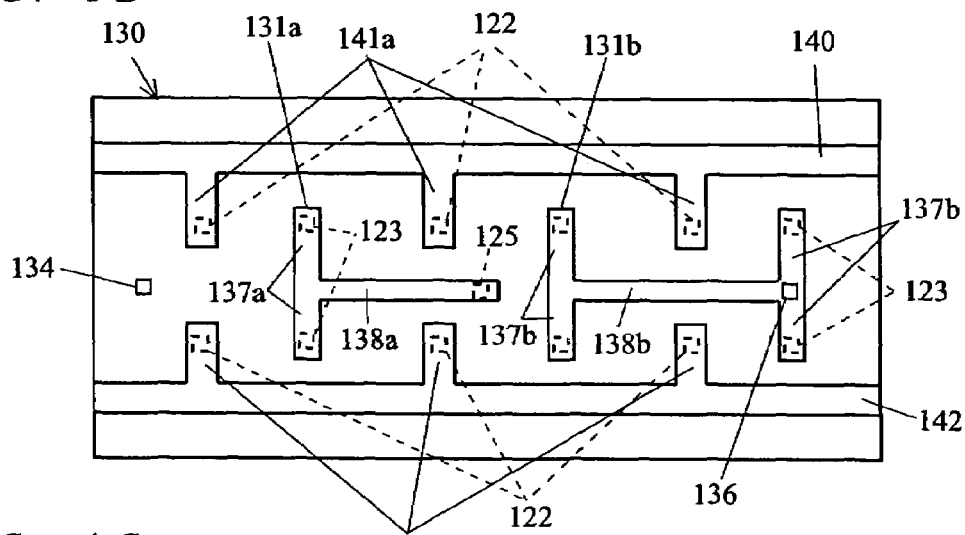
Figure 4C:
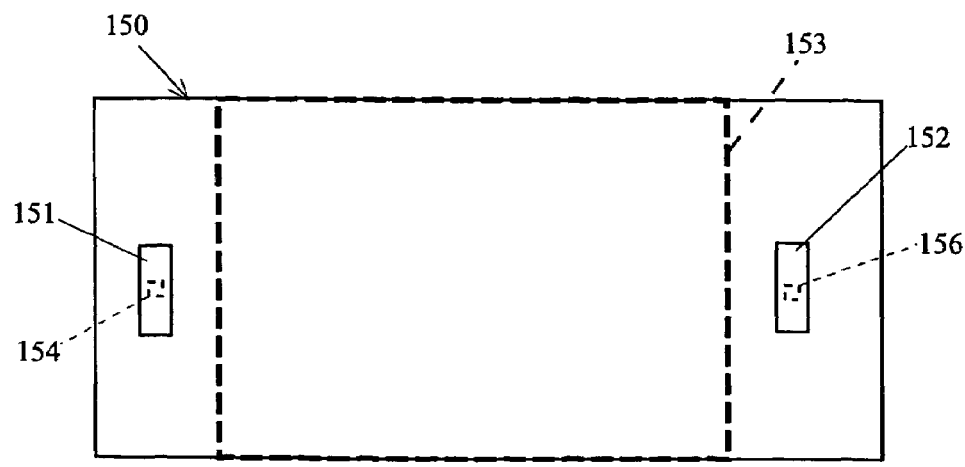

Next, the multilayer wiring structure of the cell 100 will be described with reference to FIG. 4A to FIG. 4C. Referring to FIG. 4A, three source regions 111 and three drain regions 112 are formed in the P-channel transistor region 101 of the semiconductor substrate, as indicated by broken lines. Each source region 111 and one adjacent drain region 112 are the source and drain regions of one transistor. Similarly, three source regions 113 and three drain regions 114 are formed in the N-channel transistor region 102. Three wiring layers as shown in FIG. 4A to FIG. 4C are formed on the semiconductor substrate. FIG. 4A shows a gate electrode layer 120 formed on the semiconductor substrate via a gate insulating film therebetween. FIG. 4B shows a source/drain electrode layer 130 formed on the gate electrode layer 120 via an insulating film therebetween. FIG. 4C shows a terminal layer 150 formed on the source/drain electrode layer 130 via an insulating film therebetween.

Formed in the gate electrode layer 120 shown in FIG. 4A are the preceding gate electrode section 121a, the subsequent gate electrode section 121b and contacts 122 and 123. The preceding gate electrode section 121a includes four gate electrodes 127a and a line 128a connecting the gate electrodes 127a together. The preceding gate electrode section 121a is electrically connected to the input terminal 151 formed in the terminal layer 150 via a contact 134.

The subsequent gate electrode section 121b shown in FIG. 4A includes six gate electrodes 127b and a line 128b connecting the gate electrodes 127b together. The subsequent gate electrode section 121b is electrically connected to the preceding drain electrode section 131a formed in the source/drain electrode layer 130 via a contact 135. The contacts 122 electrically connect together the source electrodes 141a and 141b formed in the source/drain electrode layer 130 and the source regions 111 and 113 of the semiconductor substrate. The contacts 123 connect together drain electrodes 137a and 137b formed in the source/drain electrode layer 130 and the drain regions 112 and 114 of the substrate.

Formed in the source/drain electrode layer 130 shown in FIG. 4B are the source electrodes 141a and 141b, the strap power supply line 140, the strap ground line 142, the preceding drain electrode section 131a, the subsequent drain electrode section 131b and the contact 134. The strap power supply line 140 is electrically connected to one of the power supply lines 320 shown in FIG. 3 for supplying the power supply voltage to the source electrodes 141a of the PMOS transistors. The strap ground line 142 supplies the ground voltage to the source electrodes 141b of the NMOS transistors. The strap power supply line 140 and the strap ground line 142 are straight lines each connecting the two opposing sides 100c and 100d of the perimeter of the cell 100. The source electrodes 141a and 141b are electrically connected to the source regions 111 of the substrate via the contacts 122.

The preceding drain electrode section 131a shown in FIG. 4B includes two drain electrodes 137a and a line 138a connecting the drain electrodes 137a together. The subsequent drain electrode section 131b includes four drain electrodes 137b and a line 138b connecting the drain electrodes 137b together. The drain electrodes 137a and 137b are electrically connected to the drain regions 112 and 114 of the substrate via the contacts 123.

The line 138a of the preceding drain electrode section 131a is a line for inputting the outputs from the drain electrodes 137a and 137b to the subsequent gate electrode section 121b. The line 138a is electrically connected to the subsequent gate electrode section 121b in the lower layer via a contact 125. The subsequent drain electrode section 131b is electrically connected to the output terminal 152 via a contact 136.

Formed in the terminal layer 150 of the cell 100 shown in FIG. 4C are the rectangular input terminal 151 and the rectangular output terminal 152. The input terminal 151 is connected to the output terminal of another one of the cells arranged in the cell arrangement region 310 shown in FIG. 3. The output terminal 152 is connected to the input terminal of another cell. Signal lines for connecting terminals of different cells are formed in the terminal layer 150.

Figure 5A:
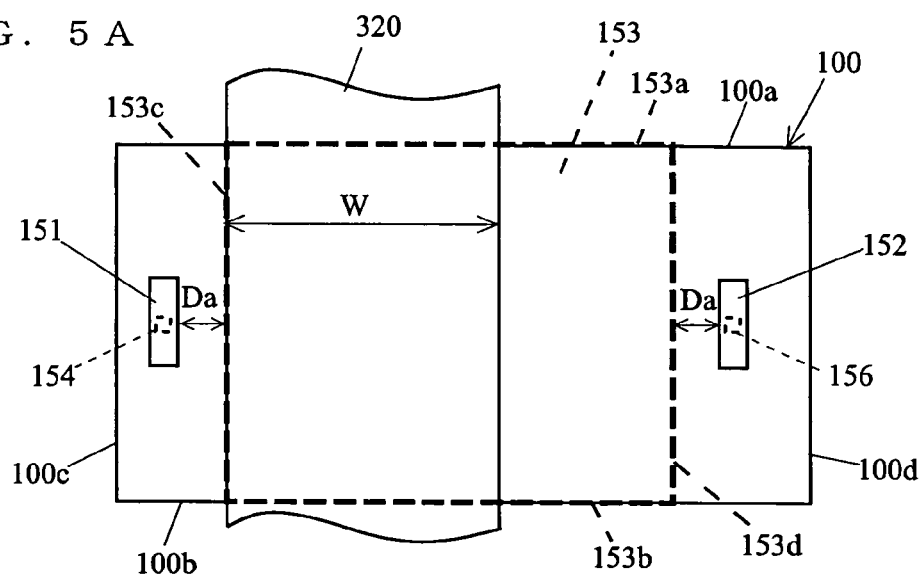
FIG. 5A to FIG. 5C each show a cell with a line being placed therein.
Figure 5B:
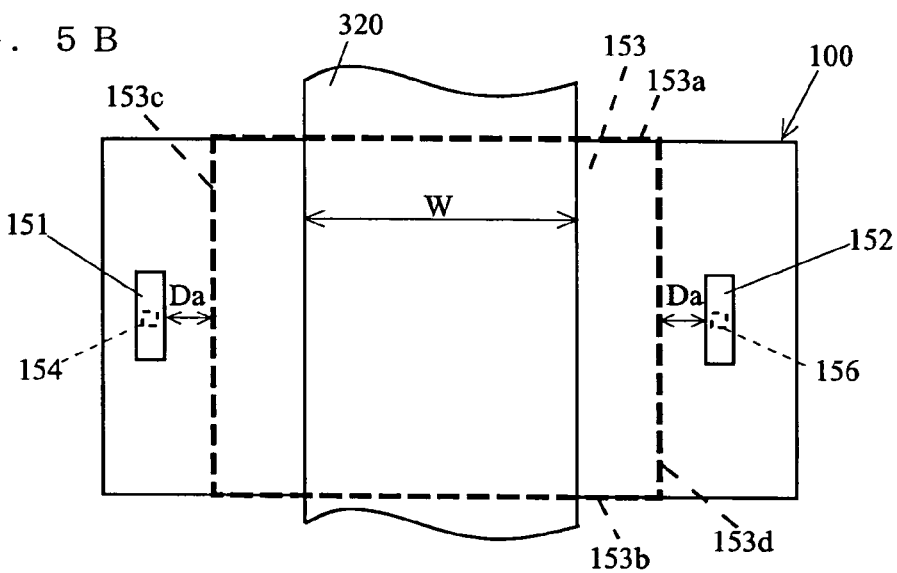
Figure 5C:
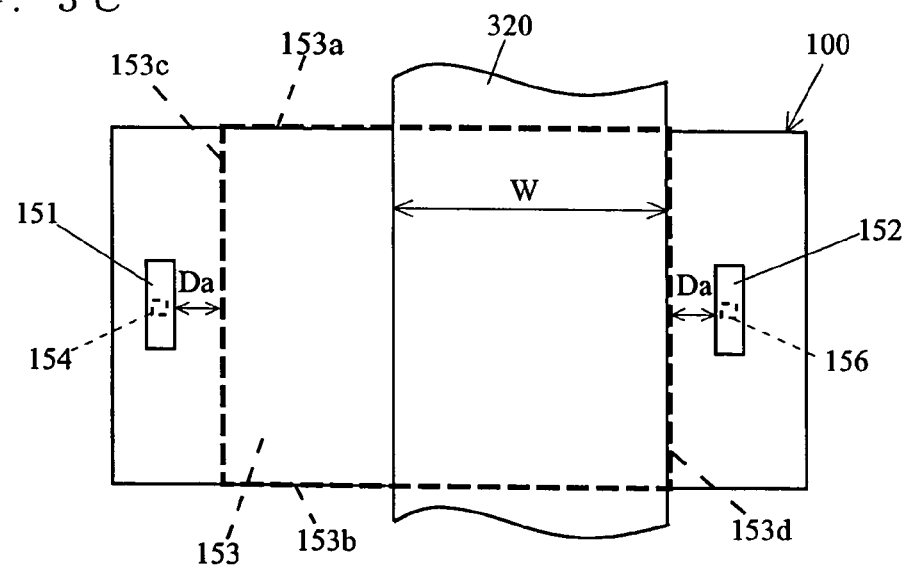

The terminal layer 150 includes the power supply line passing region 153 through which the power supply line 320 shown in FIG. 3 can be passed. Referring to FIG. 5A, FIG. 5B and FIG. 5C, the power supply line 320 having a width W can extend through the power supply line passing region 153 shown in FIG. 4C in a direction perpendicular to the longitudinal direction (the direction parallel to the long sides 100a and 100b) of the cell 100.

The power supply line passing region 153 is a rectangular internal region delimited by broken-line sides 153a to 153d. Two sides 153a and 153b of the four sides of the power supply line passing region 153 coincide with portions of the two opposing sides 100a and 100b of the cell 100. The other two sides 153c and 153d of the power supply line passing region 153 are perpendicular to the sides 153a and 153b, and are at a predetermined distance Da from the terminals 151 and 152 (more specifically, from the contact holes formed in the terminals 151 and 152), respectively.

The predetermined distance Da varies depending on the width W of the power supply line 320. Since the production yield decreases significantly if the terminals 151 and 152 are too close to the power supply line 320, the terminals 151 and 152 and the power supply line 320 are separated from each other by a predetermined distance or more so as to meet the design rule.

Figure 6A:
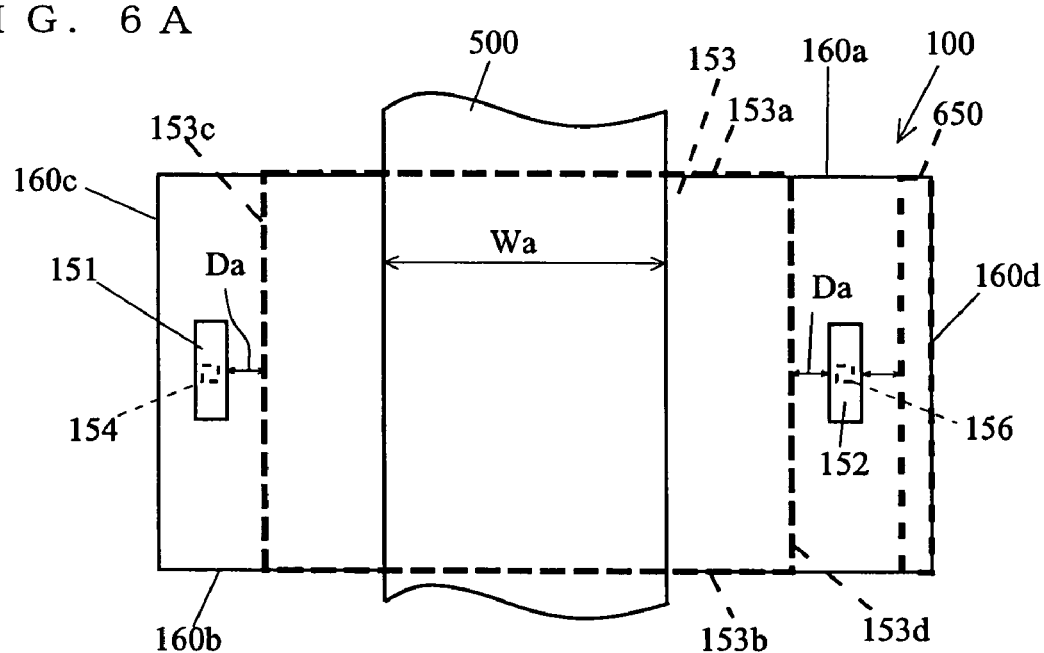
FIG. 6A and FIG. 6B are diagrams showing the relationship between the routable region and the line width.
Figure 6B:
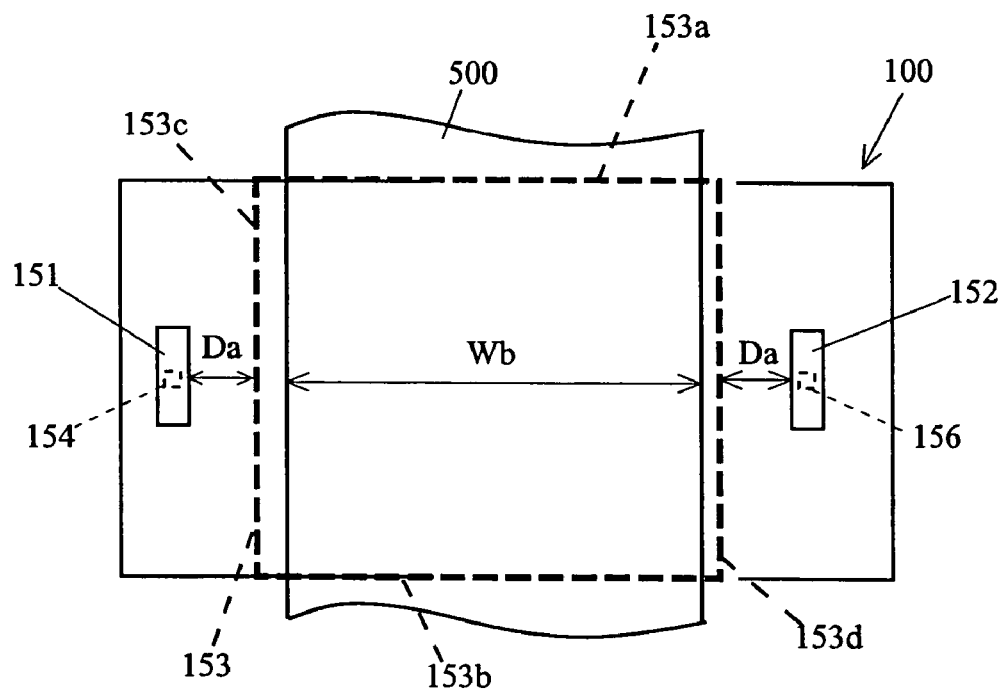

Therefore, with the same cell 100, the distance Da and the shape of the power supply line passing region 153 vary between a case where the power supply line 320 has a small width Wa as shown in FIG. 6A and a case where it has a large width Wb (Wb>Wa) as shown in FIG. 6B. A region 650 on the other side of the input terminal 151 or the output terminal 152 with respect to the power supply line passing region 153 cannot be used as the power supply line passing region 153 since the width thereof is smaller than the minimum width of a power supply line. However, if the region 650 has a width larger than the minimum width of a power supply line, the cell 100 may have two or three power supply line passing regions 153. Thus, the number of power supply line passing regions 153 included in one cell 100 is not limited one.

Figure 7A:
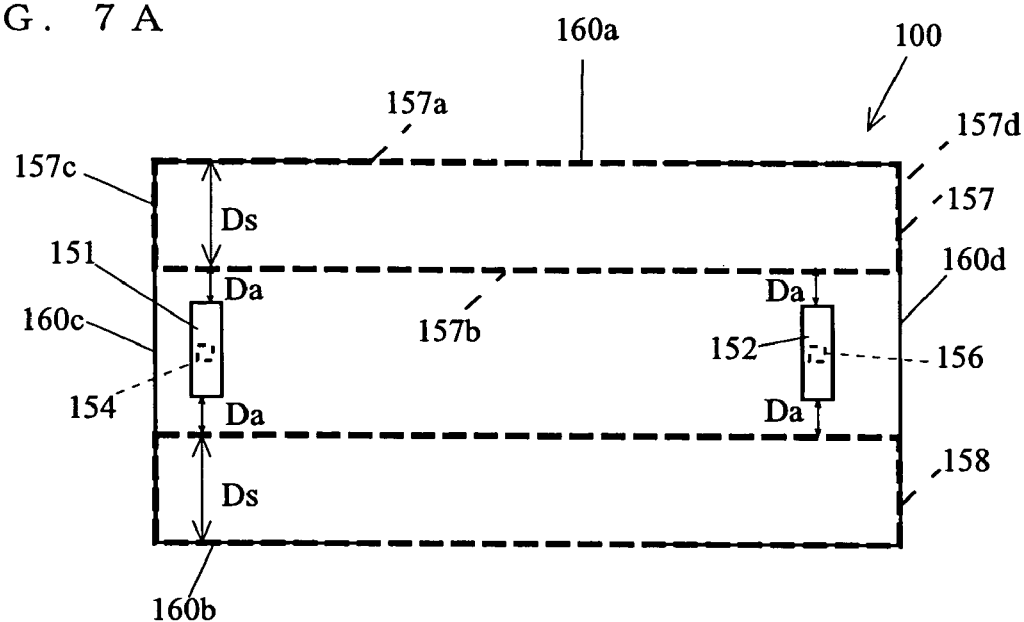
FIG. 7A and FIG. 7B show other examples of routable regions.

Referring to FIG. 7A, in a case where the width direction (longitudinal direction) of the cell 100 and the power supply line 320 are parallel to each other, regions 157 and 158 delimited by broken lines can be the power supply line passing region 153. Two sides 157c and 157d of the rectangular region 157 are portions of two opposing sides 160c and 160d of the cell 100. Another side 157a of the region 157 coincides with a side 160a of the cell 100. Still another side 157b forms a straight line at the distance Da from the input terminal 151 and the output terminal 152. The region 157 can be a power supply line passing region if the direction in which the power supply line 320 extends is parallel to the width direction of the cell 100 and if the width W of a power supply line is smaller than a distance Ds between the sides 157a and 157b. The above description also applies to the region 158.

Figure 7B:
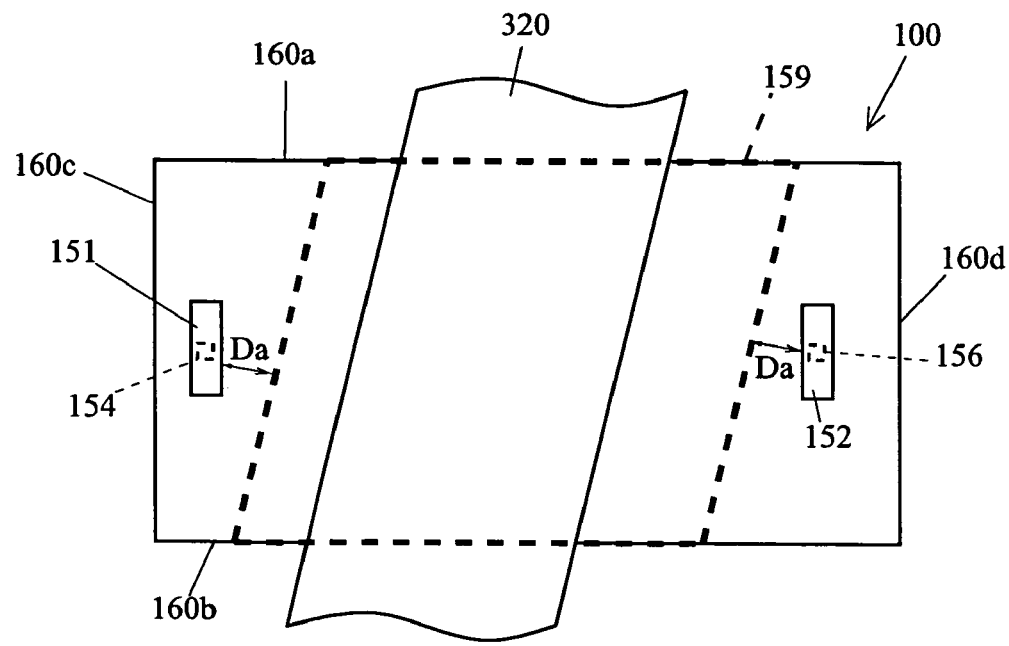

The shape of the power supply line passing region 153 is not limited to a square or a rectangular shape. For example, where the longitudinal direction of the cell 100 is at an inclined angle that is neither parallel nor perpendicular to the direction in which the power supply line 320 extends, the shape of the power supply line passing region 153 may be a parallelogram, as is a region 159 delimited by a broken line in FIG. 7B.

As described above, the shape, the number, etc., of the power supply line passing regions 153 in each cell 100 may vary depending on various factors, such as the width of the line to be provided therethrough, or the arrangement of lines between the terminals formed in the same layer. The shape and the number of the power supply line passing regions 153 in each cell 100 may be determined by a region determination section provided in an automated layout tool.

Cells of the present invention having the power supply line passing region 153, as does the cell 100, can be placed not only in portions of the cell arrangement region 310 (see FIG. 3) where the power supply lines 320 are not provided, but also in other portions thereof where the power supply lines 320 are provided (where cells cannot be placed in the prior art) Therefore, the cells of the present invention can be placed more closely together, and it is possible to realize a semiconductor device having a smaller overall area. In other words, circuit components such as transistors can be formed under the power supply lines 320, whereby the area of the cell arrangement region 310 decreases, and it is thus possible to reduce the overall size of the semiconductor device 300. Moreover, in the cell 100 of the present invention, the power supply lines 320 are passed in the layer where the terminals 151 and 152 and other lines such as signal lines are formed, instead of providing a dedicated wiring layer where only the power supply lines 320 are provided. Therefore, the number of wiring layers is not increased, whereby it is possible to suppress the number of production steps and the production cost.

Moreover, with a cell having a routable region, as does the cell of the present invention, it is not necessary to separately provide a cell arrangement region and another region for providing the power supply lines in the semiconductor device, whereby the overall size of the semiconductor device does not increase even if the width of each power supply line is increased. If the width of each power supply line is increased, the line resistance thereof decreases, whereby it is possible to suppress variations among voltages supplied to the strap power supply lines. Therefore, uniform voltages are applied to the transistors via the strap power supply lines and ground lines, whereby it is possible to prevent the transistors from malfunctioning due to noise even if the threshold voltage of the transistors is decreased. Moreover, if the width of each power supply line is increased, it is possible to prevent the power supply line from breaking due to electromigration.

Moreover, if power supply lines are passed over the cells, the distance between each cell and the voltage supply point at which a power supply line and a strap power supply line are connected together via a contact is shortened, whereby it is possible to supply uniform voltages to the cells.

While the power supply line passing region is provided in the terminal layer where the input terminal and the output terminal are formed in the present invention, the power supply line passing region may alternatively be provided in a different wiring layer having a relatively large space to spare.

Second Embodiment

Figure 8:
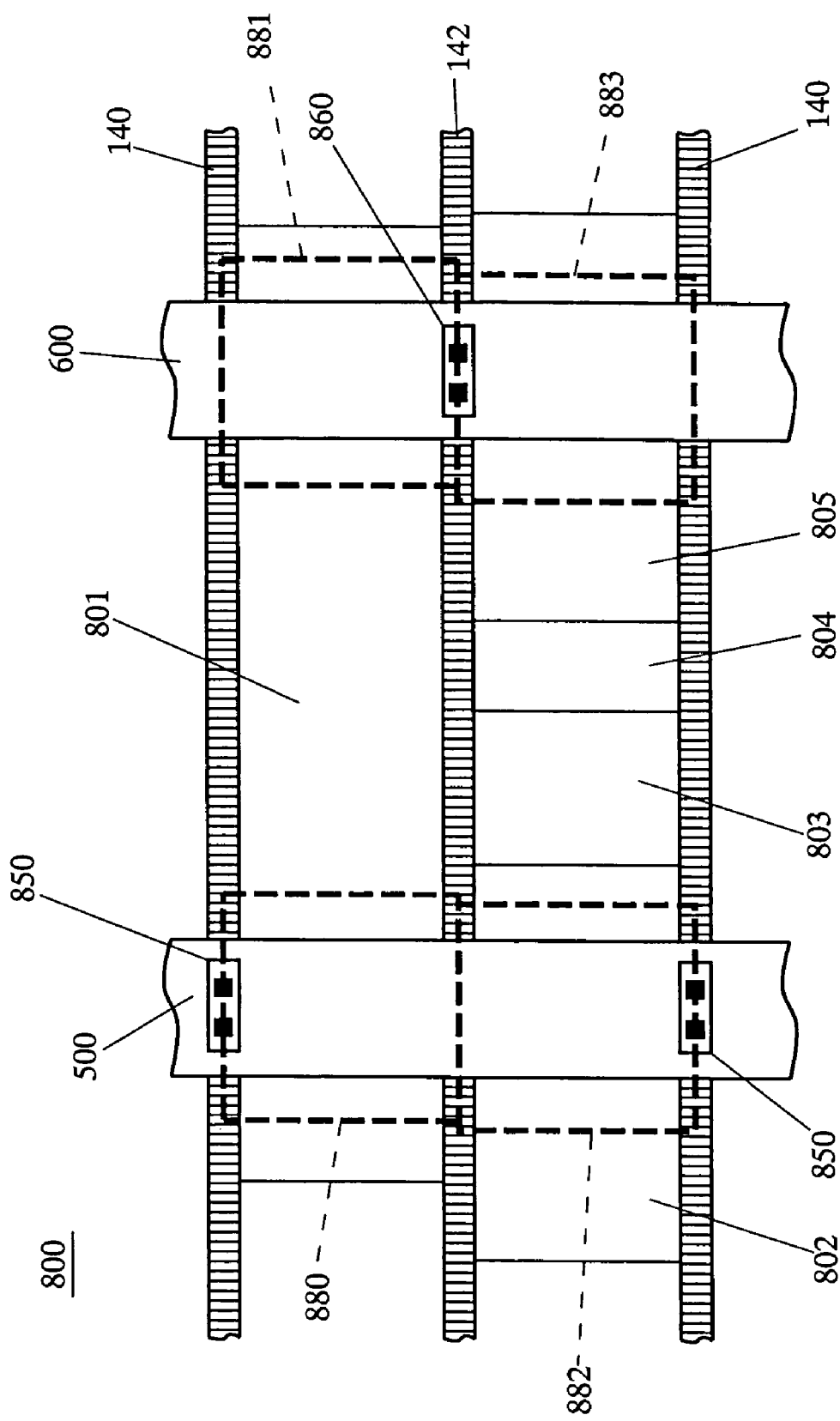
FIG. 8 is a partially cutaway plan view showing a semiconductor device according to another embodiment of the present invention.

FIG. 8 is a partially cutaway plan view showing a semiconductor device 800 according to the second embodiment of the present invention. FIG. 8 shows, on an enlarged scale, a portion of the cell arrangement region 310 of the semiconductor device 300 of the first embodiment shown in FIG. 3, for example. The semiconductor device 800 includes a plurality of cells 801, 802, 803, 804 and 805, a power supply line 500 and a ground line 600.

As with the cell of the first embodiment, each of the cells 801 to 805 includes a plurality of wiring layers on the semiconductor substrate including transistors, etc., formed thereon. Formed in the wiring layers are electrodes of the transistors, the strap power supply lines 140 for connecting the power supply lines to the electrodes, the strap ground lines 142, input terminals, output terminals, etc. The strap power supply lines 140 and the strap ground lines 142 are provided in a layer lower than the layer in which power supply line passing regions 880 to 883 of the cells 801 to 805 are provided. The connection between the power supply line 500 and the strap power supply line 140 and the connection between the ground line 600 and the strap ground line 142 are made via contacts 850 of a conductive material. Thus, a power supply voltage is supplied to cells arranged in a line in the horizontal direction from the power supply line 500 via the strap power supply line 140. Similarly, a ground voltage is supplied to cells arranged in a line in the horizontal direction from the ground line 600 via the strap ground line 142.

The cell 801 includes the power supply line passing regions 880 and 881 in the same wiring layer. The cell 802 includes the power supply line passing region 882 in the wiring layer at the same height from the substrate bottom surface as the power supply line passing regions 880 and 881 of the cell 801. Similarly, the cell 805 includes the power supply line passing region 883. The cells 801, 802 and 805 having power supply line passing regions as described above will be hereinafter referred to as "power supply line routable cells". The concept for the power supply line passing regions 880, 881, 882 and 883 is as described above in the first embodiment, and will not be further described in the present embodiment.

In the semiconductor device 800 shown in FIG. 8, power supply line routable cells 801, 802 and 805 are arranged so that the power supply line passing regions 880 and 882 are located under the power supply line 500, and the power supply line passing regions 881 and 883 under the ground line 600.

Typically, the power supply line 500 and the ground line 600 have larger widths than signal lines so as to prevent variations among power supply voltages to the cells 801 to 805 and to prevent the power supply lines from breaking due to electromigration. In the semiconductor device 800 of the present embodiment, cells can be arranged also in the space under the power supply line 500 and the ground line 600, which in the prior art is a dead space, whereby it is possible to reduce the area of the cell arrangement region and thus the size of the semiconductor device.

If cells can be arranged under the power supply line 500 and the ground line 600, the total area of the routable region decreases. Moreover, since the routable region is not divided into pieces by the power supply line 500 and the ground line 600, the area of each chunk of region where cells are arranged is larger than that in the prior art, thus increasing the freedom in the cell arrangement. Where cells are arranged by using an automated layout tool, a higher degree of cell arrangement freedom means less routing around of signal lines and a better timing convergence. Therefore, it is less likely that an obtained arrangement needs to be reexamined, thus shortening the overall design period.

Third Embodiment

Figure 9A:
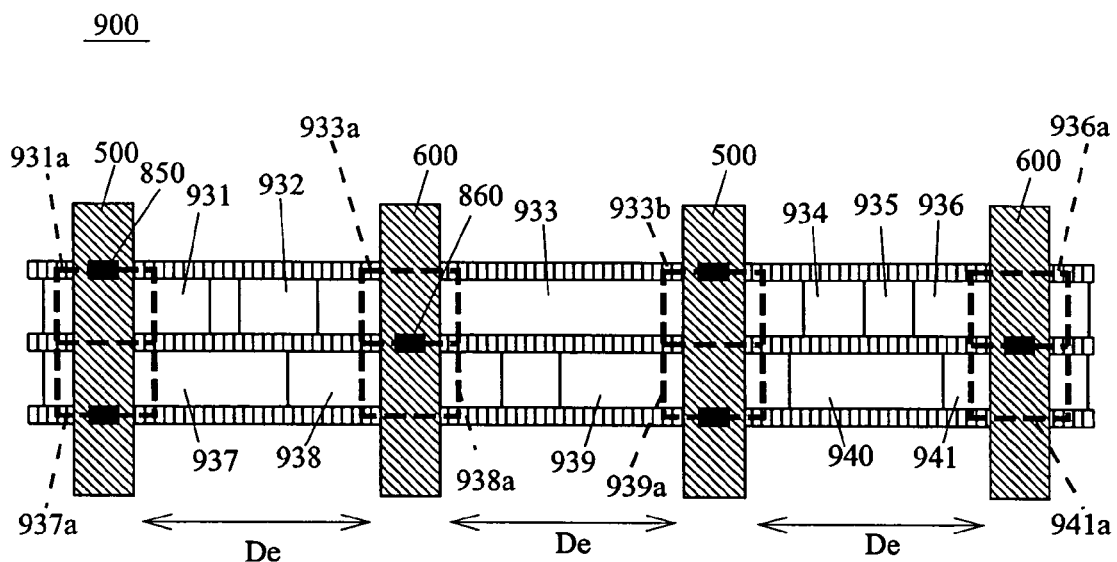
FIG. 9A and FIG. 9B show semiconductor devices according to still another embodiment of the present invention.
Figure 9B:
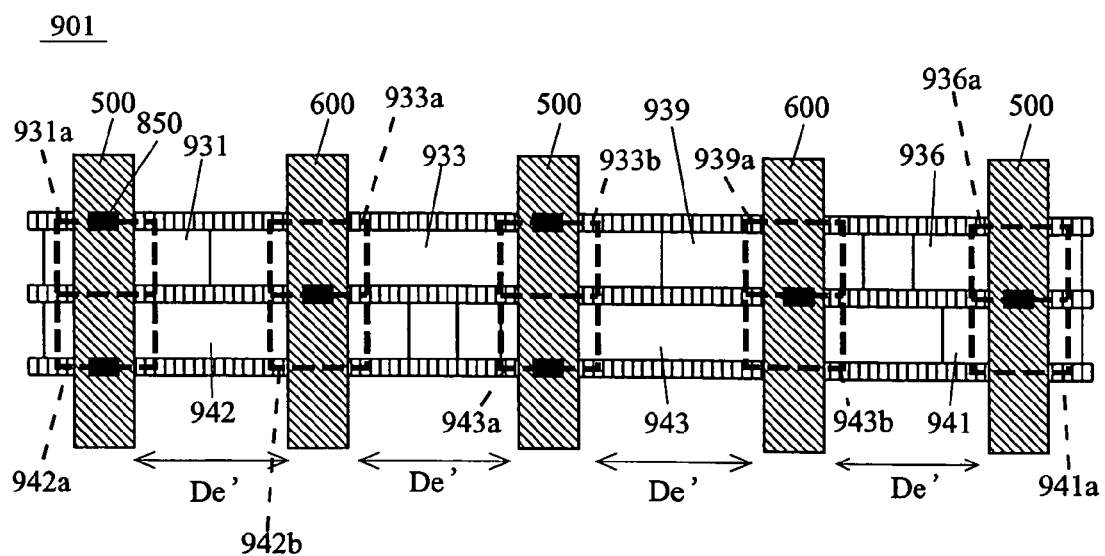

FIG. 9A and FIG. 9B are partially cutaway plan views showing semiconductor devices 900 and 901, respectively, according to the third embodiment of the present invention. The semiconductor device 900 includes power supply line routable cells 931, 933, 936, 937, 938, 939 and 941 as described above in the first and second embodiments, cells 932, 934, 935 and 940 that do not have power supply line passing regions, the power supply line 500 and the ground line 600. The cells 931, 933, 936, 937, 938, 939 and 941 each have a multilayer wiring structure with a plurality of wiring layers provided on a semiconductor substrate, as described above in the first embodiment. Power supply line passing regions 931a, 933a, 933b, 936a, 937a, 938a, 939a and 941a are provided in the same wiring layer. The concept for the power supply line passing region is as described above in the first embodiment, and will not be further described in the present embodiment. In the semiconductor device 900 shown in FIG. 9A, the power supply line 500 and the ground line 600 alternate with each other with a predetermined interval De.

In the semiconductor device 900, the power supply line routable cells 931, 933, 936, 937, 938, 939 and 941 are arranged so that the power supply line passing regions 931a, 933a, 933b, 936a, 937a, 938a, 939a and 941a are located under the lines 500 and 600.

One way to suppress variations among voltages supplied from power supply lines to cells is to increase the number of power supply lines and ground lines to be connected in parallel. The number of power supply lines to be provided in a cell arrangement region having a certain area can be increased without increasing the area by decreasing the interval between the power supply lines and ground lines. For example, if variations among voltages supplied from the power supply lines 500 to the cells with the interval De between the power supply lines 500 and the ground lines 600 shown in FIG. 9A, the interval can be reduced to De' as shown in FIG. 9B. As the line interval is changed from De to De', some cells in the cell arrangement region shown in FIG. 9A are replaced with cells in other regions, resulting in an arrangement as shown in FIG. 9B.

If the interval between the power supply lines 500 and the ground lines 600 is reduced without changing the width thereof, the area of the cell arrangement region that is occupied by the power supply lines or ground lines is increased. However, with the semiconductor device 900 of the present invention, cells can be arranged under the power supply lines 500 and the ground lines 600, whereby it is less likely that the overall size of the semiconductor device increases even if the number of lines and the line interval are changed during the design process.

Fourth Embodiment

Figure 10A:
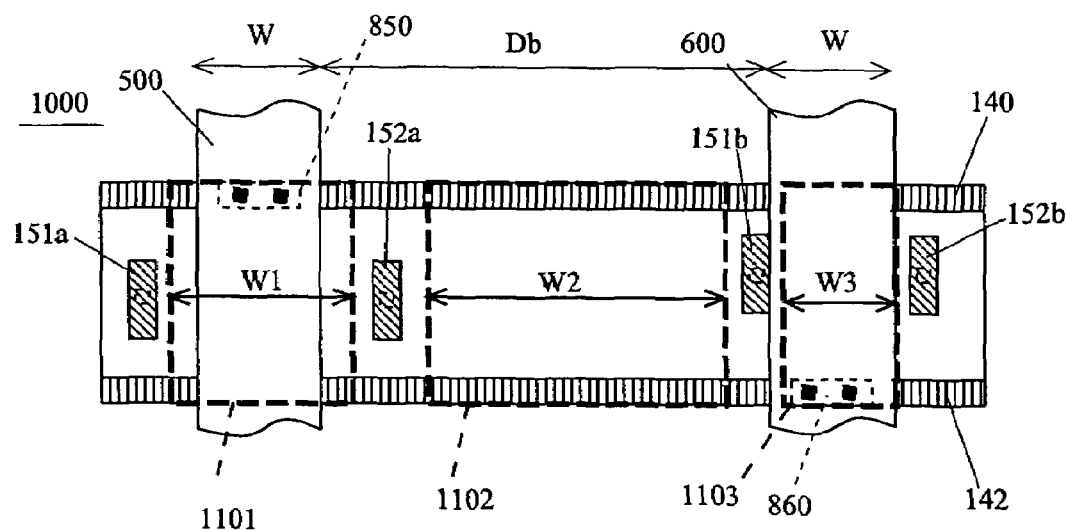
FIG. 10A and FIG. 10B show a cell according to still another embodiment of the present invention.
Figure 10B:
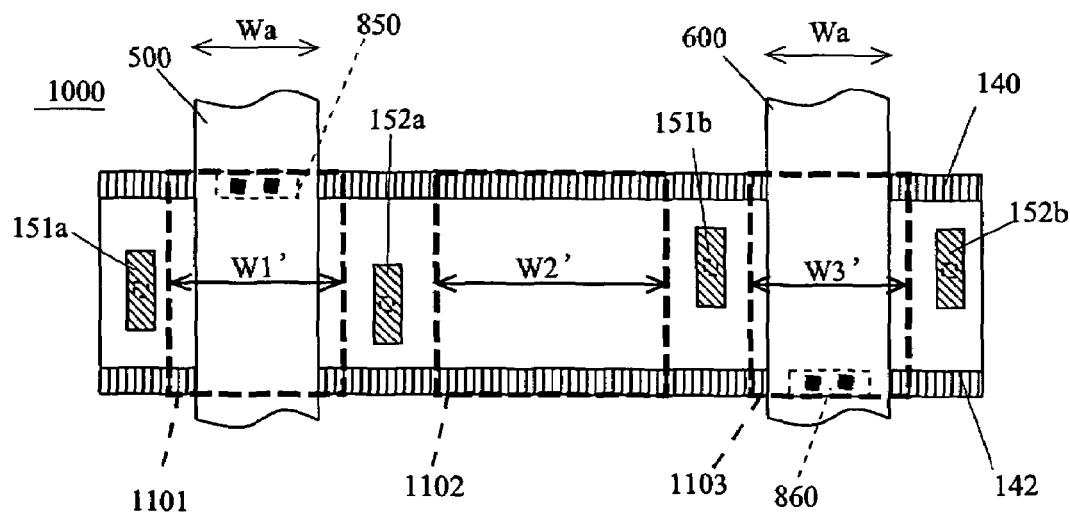

FIG. 10A and FIG. 10B show a cell 1000 and how the power supply line 500 and the ground line 600 are arranged in power supply line passing regions 1101 and 1103 of the cell 1000 according to the fourth embodiment of the present invention. As with the cell 100 of the first embodiment shown in FIG. 4, the cell 1000 of the present embodiment includes a gate electrode layer, a source/drain electrode layer and a terminal layer formed on a semiconductor substrate including transistors, etc., formed thereon. However, unlike the cell 100 of the first embodiment, the logic circuit of the cell 1000 includes two input terminals 151a and 151b and two output terminals 152a and 152b in the terminal layer.

In the cell 1000 of the present embodiment, as registered in the cell library, the terminals 151a, 151b, 152a and 152b are arranged as shown in FIG. 10A. In the cell 1000 shown in FIG. 10A, the power supply line passing regions 1101, 1102 and 1103 have widths W1, W2 and W3, respectively. FIG. 10A shows how the power supply line 500 and the ground line 600 are arranged in the cell 1000 with a line interval Db. In FIG. 10A, the width Wa of the ground line 600 is smaller than the width W3 of the power supply line passing region 1103, whereby the ground line 600 cannot be placed properly as it is.

However, with the cell 1000 of the present invention, the shapes of the power supply line passing regions 1101, 1102 and 1103 can be modified as shown in FIG. 10B by changing the positions of the terminals 151a, 151b, 152a and 152b. A cell in which positions of terminals can be changed will be briefly described below with the cell 100 of the first embodiment shown in FIG. 1.

In the cell 100 shown in FIG. 1, the preceding gate electrode section 121a in the gate electrode layer 120 is electrically connected to the input terminal 151 via the contact 134 formed in the line 128a of the preceding gate electrode section 121a, as shown in FIG. 4A. Therefore, the position of the terminal 151 can be changed by, for example, elongating the line 128a so as to outwardly move the connection point with the contact 134 from that shown in FIG. 4A. Alternatively, a line extending outwardly from the contact 134 may be formed in a layer lower than the terminal layer 150, e.g., the source/drain electrode layer 130 shown in FIG. 4B, so that the input terminal 151 and the preceding gate electrode section 121a are connected to each other via this additional line and the contact 134. In such a case, the preceding gate electrode section 121a and the input terminal 151 are connected to each other via a contact between the preceding gate electrode section 121a and the additional line, the additional line, and another contact between the additional line and the terminal 151.

With such freedom in the terminal arrangement, it is possible to move a terminal according to the interval between power supply lines and ground lines and change the shapes of the power supply line passing regions so that the power supply lines and the ground lines can pass through the cells. Then, the cells can be arranged under the power supply lines and the ground lines, and it is possible to reduce the overall area of the semiconductor device.

Even in a case where the cell layout is determined before setting the interval between power supply lines and ground lines, the terminals can be later moved according to the determined line interval. Therefore, it is no longer necessary to develop cells each time a semiconductor device is designed. In other words, the present invention provides cells that are more general-purpose, and it is thus possible to suppress the cost of a semiconductor device or a cell.

Fifth Embodiment

Figure 11A:
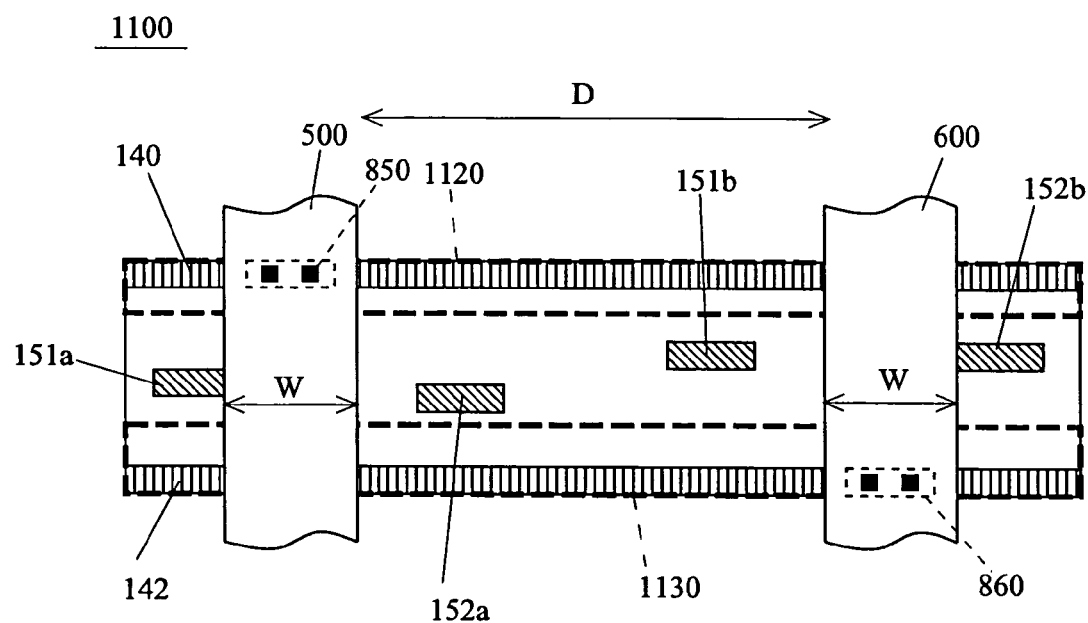
FIG. 11A and FIG. 11B show a cell according to still another embodiment of the present invention.
Figure 11B:
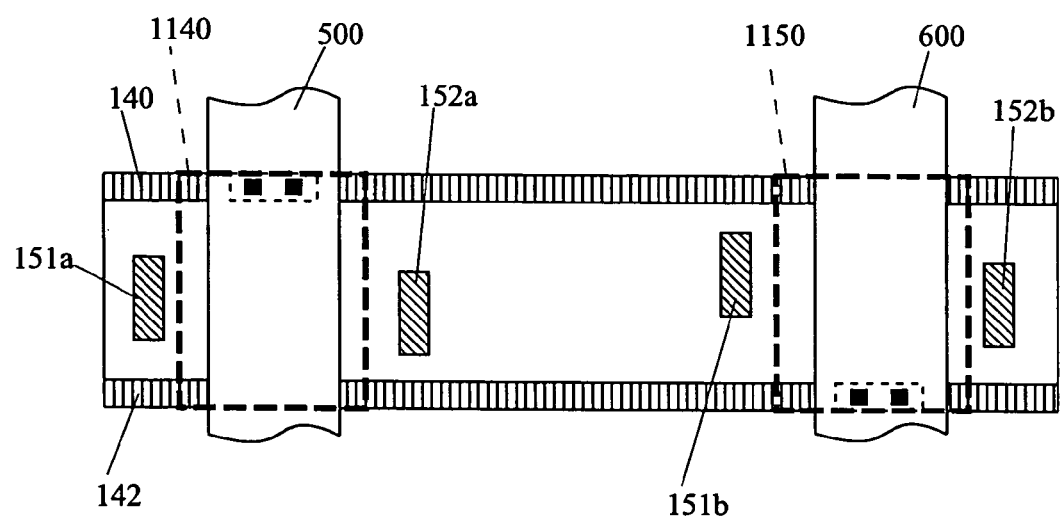

FIG. 11A and FIG. 11B show a cell 1100 according to the fifth embodiment of the present invention. The structure, etc., of the cell 1100 are similar to those of the first and other embodiments, and will not be further described below. Referring to FIG. 11A, the rectangular terminals 151a, 151b, 152a and 152b are arranged so that their longitudinal direction is parallel to that of the cell 1100. This arrangement of the terminals 151a, 151b, 152a and 152b assumes that power supply lines and ground lines are to be arranged parallel to the longitudinal direction of the cell 1100. With such an arrangement, power supply line passing regions 1120 and 1130 are as shown by broken lines in FIG. 11A. If the cell 1100 is to be arranged so that the longitudinal direction thereof is perpendicular to the direction in which the power supply line 500 and the ground line 600 having a width W extend, the terminals 151a and 152b will be in contact with the lines 500 and 600 as shown in FIG. 11A.

Figure 12:
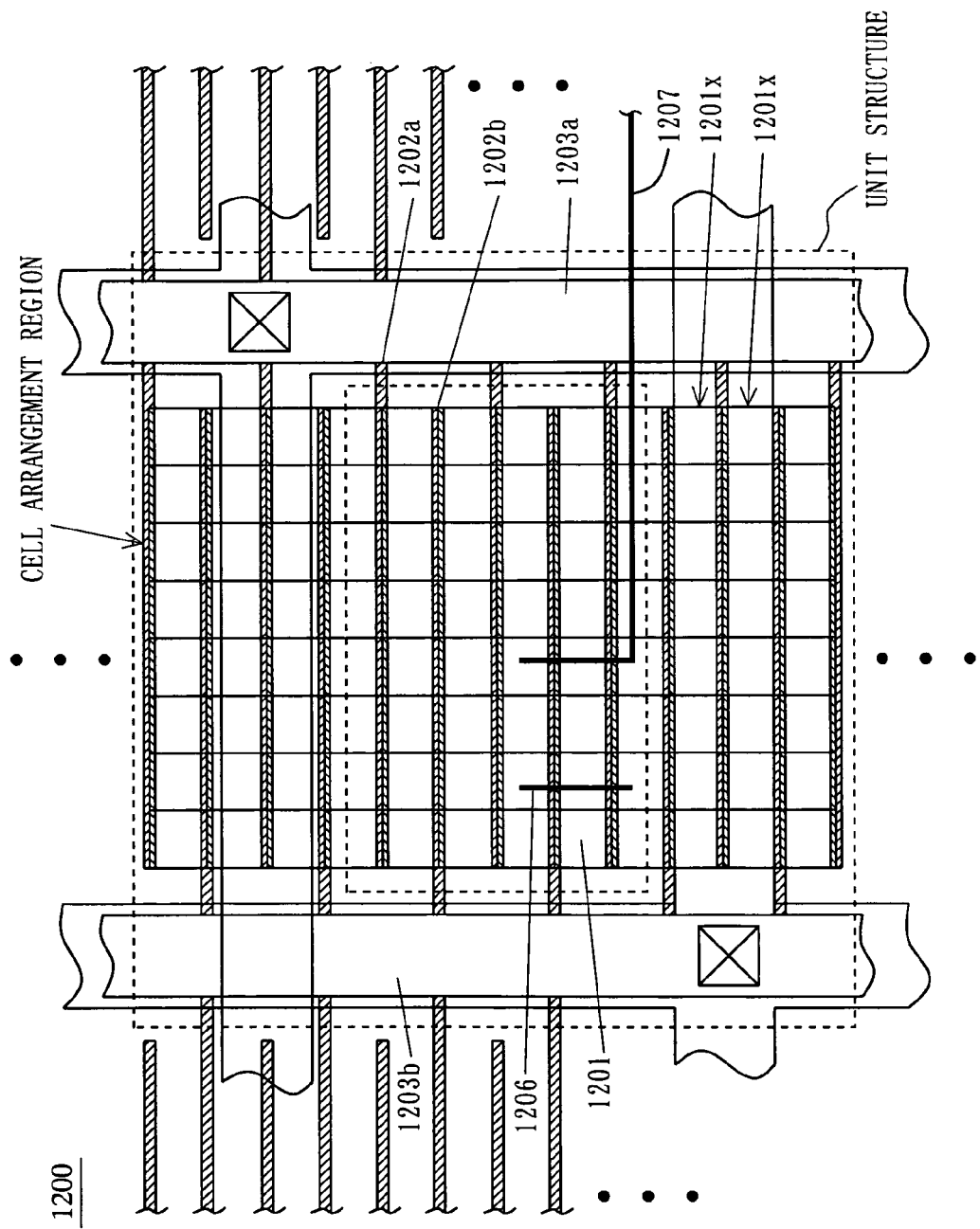
FIG. 12 is a schematic plan view showing a conventional semiconductor device.

In such a case, the arrangement of the terminals 151a, 151b, 152a and 152b (including the orientations and the positions thereof) can be changed from that shown in FIG. 12A to that shown in FIG. 12B. Rearranging the terminals 151a, 151b, 152a and 152b in this way results in power supply line passing regions 1140 and 1150 as shown in FIG. 12B. The interval between the power supply line passing regions 1140 and 1150 is adjusted according to the interval between the power supply line 500 and the ground line 600.

Thus, according to the present embodiment, the terminals can be rearranged according to the direction in which lines extend so as to create power supply line passing regions that are suitable for the width and the interval of the power supply lines, etc. As the terminals can be rearranged so that cells can be placed under the power supply lines and the ground lines, the area of the cell arrangement region is decreased, and it is possible to reduce the overall size of the semiconductor device. Moreover, allowing for the rearrangement of terminals makes the cells more general-purpose, and it is no longer necessary to develop cells for each semiconductor device, thus suppressing the cost for developing a semiconductor device.

The semiconductor device and cells of the present invention as described above are useful in applications such as small-size, low-power semiconductor devices.

While the invention has been described in detail, the foregoing description is in all aspects illustrative and not restrictive. It is understood that numerous other modifications and variations can be devised without departing from the scope of the invention.

What is claimed is:

1. A cell including two or more wiring layers and being a component of a semiconductor integrated circuit as a functional unit registered in a cell library used by an automated design tool, the cell comprising:
   one or more transistors formed on a semiconductor substrate;
   a pair of intracellular power supply lines for supplying a power supply voltage and a ground voltage to the one or more transistors; and
   a plurality of connection terminals for inputting or outputting a signal of a circuit formed by the one or more transistors,
   wherein at least one power supply line passing region is provided in one of the wiring layers in which the intracellular power supply lines are not provided so that an intercellular power supply line having a width larger than those of the intracellular power supply lines can pass through the at least one power supply line passing region,
   wherein the power supply line passing region is provided between the plurality of connection terminals, and
   wherein the entire portion of the connection terminal is formed in the same wiring layer as the at least one power supply line passing region.

2. The cell according to claim 1, wherein the pair of intracellular power supply lines extend parallel to each other, and the at least one power supply line passing region has a shape such that the intercellular power supply line can pass through the at least one power supply line passing region in a direction perpendicular to the intracellular power supply lines.

3. The cell according to claim 1, wherein two sides of a perimeter of the at least one power supply line passing region coincide with at least portions of two sides of a perimeter of the cell.

4. The cell according to claim 3, wherein the at least one power supply line passing region has a rectangular shape.

5. The cell according to claim 1, wherein a side of a perimeter of the at least one power supply line passing region is a predetermined distance or more away from the connection terminal.

6. The cell according to claim 5, wherein the predetermined distance is determined based on a predetermined width of the intercellular power supply line.

7. The cell according to claim 1, wherein an arrangement of the terminal is determined based on a predetermined interval between two adjacent intercellular power supply lines.

8. The cell according to claim 1, wherein an arrangement of the terminal is determined based on a predetermined direction in which the intercellular power supply line is passed.

9. The cell according to claim 1, wherein a width of the cell is larger than that of the intercellular power supply line.

10. The cell according to claim 1, wherein at least one of the one or more transistors is formed in a region of the semiconductor substrate that corresponds to the at least one power supply line passing region.

11. The cell according to claim 1, wherein a minimum width of the at least one power supply line passing region is larger than a width of the intercellular power supply line.

12. The cell according to claim 1, wherein a length of the intercellular power supply line is larger than that of a side of a perimeter of the cell.

13. A cell including two or more wiring layers and being a component of a semiconductor integrated circuit as a functional unit registered in a cell library used by an automated design tool, the cell comprising:
   one or more transistors formed on a semiconductor substrate;
   a pair of intracellular power supply lines for supplying a power supply voltage and a ground voltage to the one or more transistors; and
   a plurality of connection terminals for inputting or outputting a signal of a circuit for inputting or outputting a signal formed by the one or more transistors,
   wherein at least one power supply line passing region is provided in one of the wiring layers in which the intracellular power supply lines are not provided so that an intercellular power supply line having a width larger than those of the intracellular power supply lines can pass through the at least one power supply line passing region, and
   wherein the entire portion of each of the plurality of connection terminals and the power supply line passing region are provided in a same wiring layer.

14. A cell-based semiconductor integrated circuit including two or more wiring layers and one or more cells according to claim 13, the semiconductor integrated circuit further comprising:
   an intercellular power supply line that passes through the power supply line passing region in at least one of the one or more cells.

* * * * *